United States Patent [19]
Halin et al.

[11] Patent Number: 5,508,626
[45] Date of Patent: Apr. 16, 1996

[54] CIRCUIT FOR DETECTING THE POSITION OF SEVERAL BIPOLAR CONTACTORS AND APPLICATION FOR A THRUST REVERSER OF A TURBOJET ENGINE

[75] Inventors: Yves R. Halin, Saint Germain les Corbeil; Eric C. Pean, Chennevieres, both of France

[73] Assignee: Societe Nationale d'Etude et de Construction de Moteurs d'Aviation "SNECMA", Paris, France

[21] Appl. No.: 289,252

[22] Filed: Aug. 11, 1994

[30] Foreign Application Priority Data

Aug. 12, 1993 [FR] France ................................ 93 09895

[51] Int. Cl.$^6$ ........................... G01R 27/08; G08B 25/00
[52] U.S. Cl. ........................ 324/713; 324/537; 324/768; 340/505; 340/686
[58] Field of Search ...................... 324/537, 713, 324/765, 768, 769; 340/505, 508, 511, 686, 687

[56] References Cited

U.S. PATENT DOCUMENTS

| | | | |
|---|---|---|---|
| 3,550,090 | 12/1970 | Baker, Jr. et al. | 340/505 X |
| 3,821,733 | 6/1974 | Reiss et al. | 340/514 |
| 4,359,721 | 11/1982 | Galvin et al. | 340/505 X |
| 4,441,100 | 4/1984 | Galloway | 340/518 |
| 4,555,695 | 11/1985 | Machida et al. | 340/505 |

FOREIGN PATENT DOCUMENTS

| | | |
|---|---|---|
| 0046096 | 2/1982 | European Pat. Off. . |
| 0164838 | 12/1985 | European Pat. Off. . |
| 0217224 | 4/1987 | European Pat. Off. . |
| WO90/16114 | 12/1990 | WIPO . |
| WO92/14305 | 8/1992 | WIPO . |

Primary Examiner—Kenneth A. Wieder
Assistant Examiner—Diep Do
Attorney, Agent, or Firm—Oblon, Spivak, McClelland, Maier & Neustadt

[57] ABSTRACT

The circuit of the present invention is able to detect and identify the position of several contactors.

Each contactor (1) is mounted in series with a resistor (2). The first contacts ($A_N$) are interconnected. The same applies for the second contacts ($B_N$) and the third points ($C_N$) of the branches established. In addition, the third points ($C_N$) are separated by a second resistor (6). The measuring of the voltage between the first and third points (A, C) makes it possible to detect and identify the open and closed contactors and in addition is able to detect a malfunction.

Application for detecting the position of the doors of a thrust reverser of a turbojet engine.

6 Claims, 2 Drawing Sheets

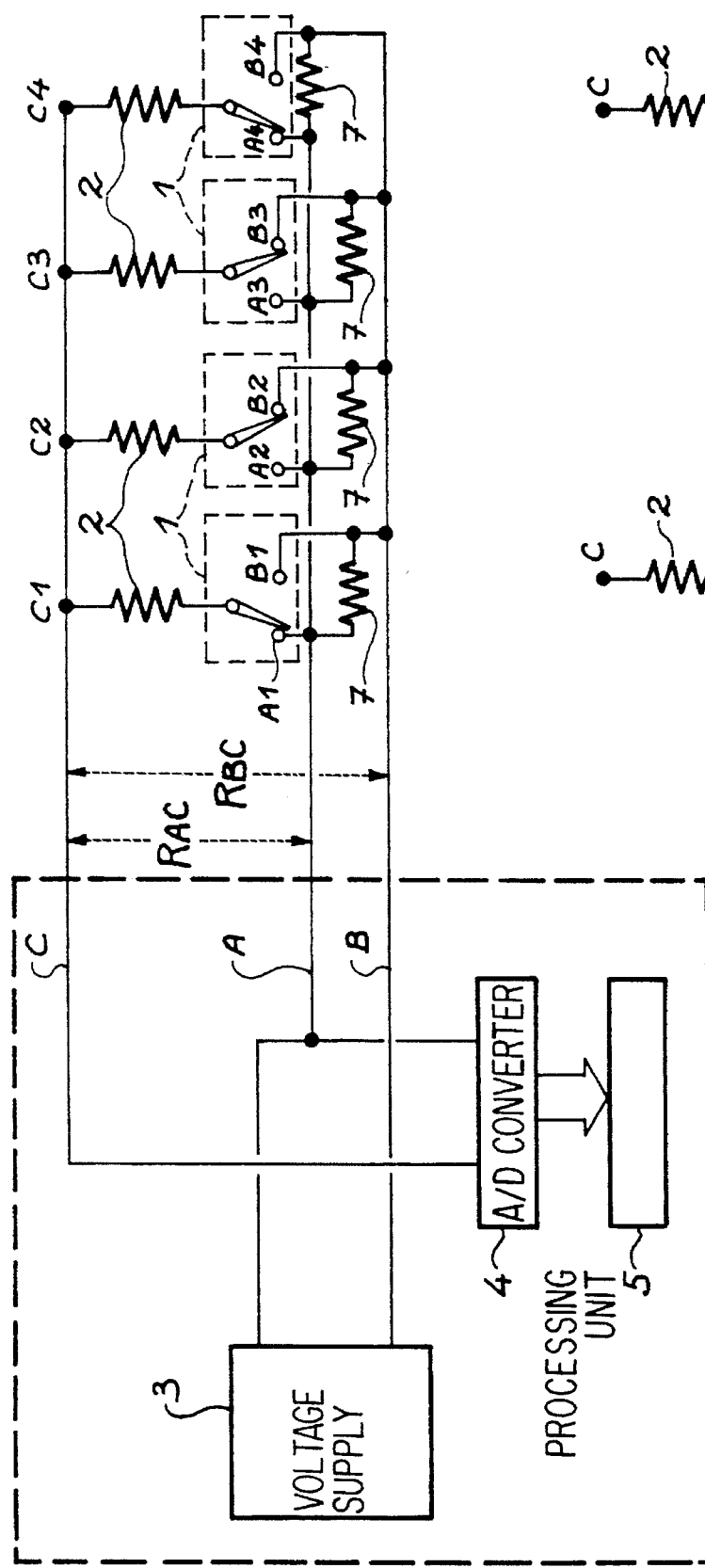
FIG. 2
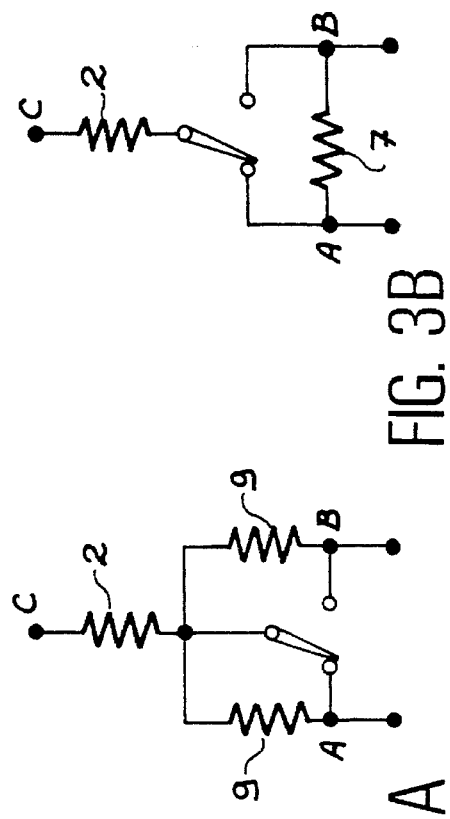
FIG. 3A
FIG. 3B

CIRCUIT FOR DETECTING THE POSITION OF SEVERAL BIPOLAR CONTACTORS AND APPLICATION FOR A THRUST REVERSER OF A TURBOJET ENGINE

FIELD OF THE INVENTION

The invention concerns detecting the state of several bipolar contactors each used in the same conditions. As the circuit is able to detect each of the contactors, one particularly advantageous application is provided to control the position of the thrust reverser doors on turbojet engines.

BACKGROUND OF THE INVENTION

All the turbojet engines used on modern civil and military aircraft have centralized digital regulation so as to control all the operating parameters of the turbojet engine in question. In this system, the computer determines the actions to be taken on the various power devices of the turbojet engine on the basis of information sent to it by the various specific computers of the aircraft and the various sensors, such as contactors.

In these conditions, one can readily understand that the increasing of the number of its inputs and outputs of the computer is expressed via an increase of the number of contacts and connectors opposite in front of the computer. This also results in increasing the internal complexity of the computer. This may thus result in a dimensioning of the computer no longer solely depending on the volume occupied by the electronics of said computer but by the minimum surface area required for placing the connectors. Therefore, an effort has been made to try to reduce the number of physical inputs opposite in front of the computer but without suppressing the amount of information transmitted.

As part of a study concerning the door thrust reverser system for a turbojet engine seeking to improve the reliability and safety of this system, it is essential to simplify the number of connections of the door control circuit.

SUMMARY OF THE INVENTION

To this effect, the first main object of the invention is a circuit able to detect the position of several bipolar contactors each connected between one first point and one second point and between the first point and a third point.

According to the invention, the contactors are mounted in parallel. A resistor with a specific value is mounted in series with each contactor. A voltage power source is used between the first point and the third point. An analog/digital converter is connected between the first and second points so as to provide a measuring signal. A device is used for processing the measuring signal in question derived from the analog/digital converter.

In one first embodiment, a second resistor with a specific value is inserted between each of the branches constituted by one contactor and one resistor.

The first resistors preferably have a value of 2R, whereas the second resistors have a value of R.

In a second embodiment, a third resistor with a specific value is placed between the two contacts of each contactor.

In this case, the second and third resistors preferably have the same value.

A second main object of the invention is to provide a device for detecting the position of the doors of a thrust reverser on a turbojet engine and using a circuit as described above, the mobile portion of each contact being connected to the door of a reverser so that that two positions of the contactors are characteristic of the open and closed positions of the doors of the reverser.

BRIEF DESCRIPTION OF THE DRAWINGS

The invention and its various characteristrics shall be more readily understood from a reading of the description accompanied by the figures respectively being:

FIG. 2 is a diagram of the second embodiment of the circuit of the invention,

FIGS. 3A and 3B are two diagrams of the electric equivalence of two contactors used in the second embodiment of the circuit of the invention.

DETAILED DESCRIPTION OF THE PREFERRED EMBODIMENTS

FIRST EMBODIMENT

Figure 1:
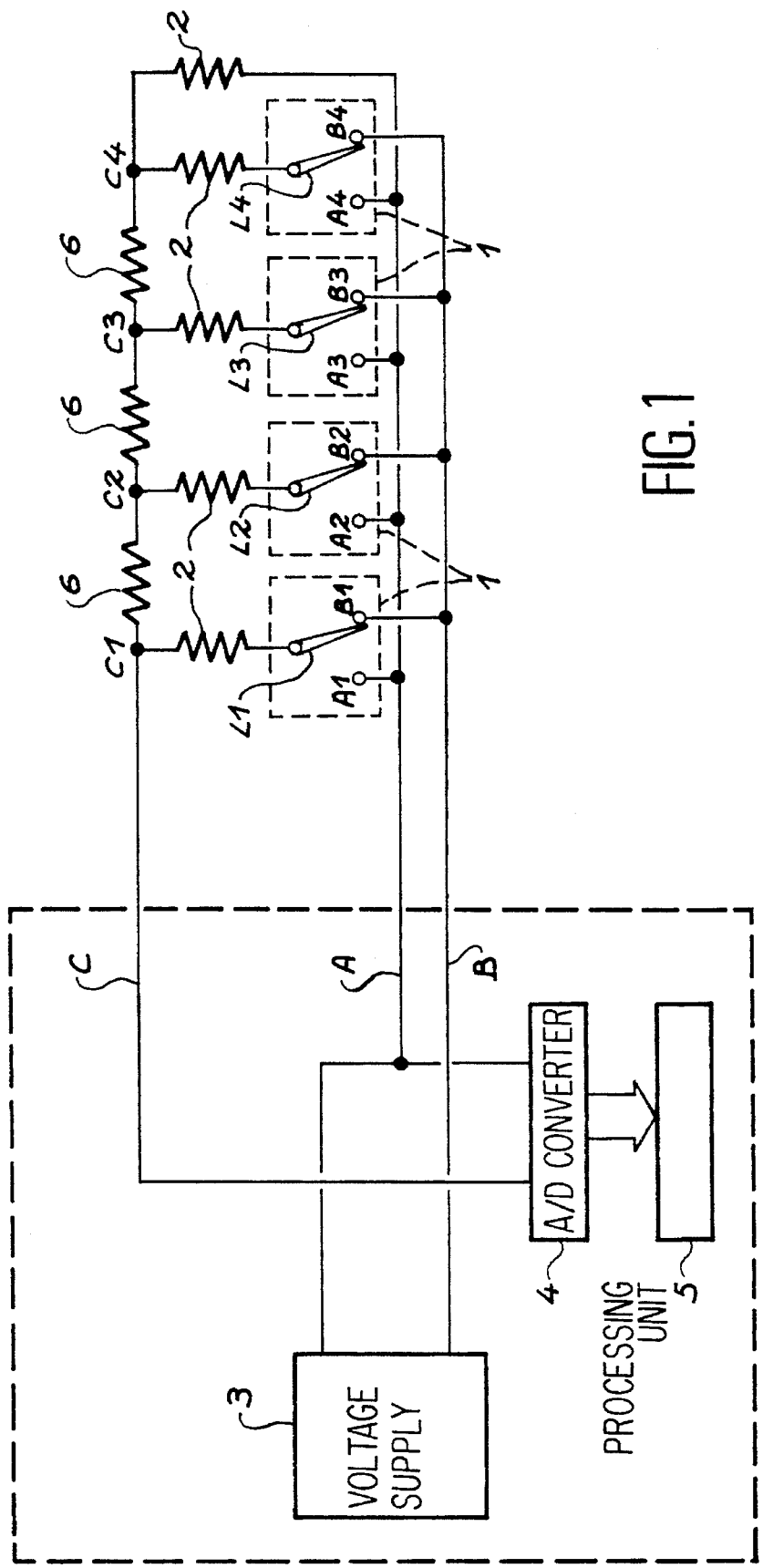
FIG. 1 is a diagram of the first embodiment of the circuit of the invention.

With reference to FIG. 1, the circuit includes several bipolar contactors 1, namely 4 in FIG. 1. These bipolar contactors 1 are mounted in parallel in relation to one another. As, as regards their application, they are placed on mobile elements so as to determine the positioning state between two specific positions.

Each contactor is composed of a mobile lever L with one end possibly being placed in contact with either one first contact $A_N$ or a second contact $B_N$. The first contacts $A_N$ are interconnected and connected to a first point A. Similarly, the second contacts $B_N$ are interconnected and interconnected to a second point B.

Associated with each connector 1 is a resistor 2 mounted in series with the contactor 1 so as to constitute a contactor branch. The end of this branch constituted by the free end of the resistor 2 constitutes a third point $C_N$ of the branch of the connector. All the three points $C_N$ are interconnected and connected to a third point C.

The circuit is completed by a second resistor 6 placed between each successive third point $C_1, C_2 \ldots, C_N$, that is between the ends connected to the point C of the contactor branches. The value of the second resistors is preferably equal to half R of the value 2R of the first resistors 2.

The circuit has an electric voltage supply 3 which provides a voltage between the first point A and the second point B and thus to their respective points in each contactor branch, that is between each of the two contacts $A_N$ and $B_N$ of each contactor 1. Moreover, the branch of the first contacts, that is the first point A, is connected to the third point C by means of a resistor 2 equivalent to the resistors used in the contactor branches.

Thus, the voltage at the point C is a measuring signal which is characteristic of the state of the four contactors 1. By measuring the voltage between the first points A and third points C, information is obtained characteristic of the state of these four contactors. A analog/digital converter 4 is thus used to this effect. Its two inputs are connected the first point A and third point C respectively.

The following table shows how the voltage signal between the first point A and the third point C can be exploited within the context of the use of four contactors numbered from 1 to 4. In the case where a voltage of ten volts is applied between the first point A and the second point B, the voltage measured between the first point A and the third point C may vary from between zero and ten volts. Each value measured is a multiple of one sixteenth of this value of ten volts. It can be seen that each of these sixteen values is different, which makes it possible to identify, not only the number of open or closed contactors, but in particular identify the open or closed contactors.

| 1 | 2 | 3 | 4 | U (A-B) Volts |
|---|---|---|---|---|
| 0 | 0 | 0 | 0 | 0 |
| 0 | 0 | 0 | 1 | 10/16 |
| 0 | 0 | 1 | 0 | 2*10/16 |
| 0 | 0 | 1 | 1 | 3*10/16 |
| 0 | 1 | 0 | 0 | 4*10/16 |
| 0 | 1 | 0 | 1 | 5*10/16 |
| 0 | 1 | 1 | 0 | 6*10/16 |
| 0 | 1 | 1 | 1 | 7*10/16 |
| 1 | 0 | 0 | 0 | 8*10/16 |
| 1 | 0 | 0 | 1 | 9*10/16 |
| 1 | 0 | 1 | 0 | 10*10/16 |
| 1 | 0 | 1 | 1 | 11*10/16 |
| 1 | 1 | 0 | 0 | 12*10/16 |
| 1 | 1 | 0 | 1 | 13*10/16 |
| 1 | 1 | 1 | 0 | 14*10/16 |
| 1 | 1 | 1 | 1 | 15*10/16 |

Each column relates to one contactor and contains the binary numbering of the state of the contactor in question. Thus, sixteen possible combinations are possible. The first line of columns (0,0,0,0) symbolizes the four closed contactors, whereas the last line (1,1,1,1) symbolizes the four open contactors.

The last column indicates the values of the voltage U measured between the first point A and the third point C. These values are graduated from zero to ten volts successively increased by ten sixteenths of volts.

It is to be noted that the fraction voltage U measured between the first point A and the third C is independent of the values of the resistors 2 and 6. This may have an important bearing in the event of temperature variations, the drift of each resistor being the same for all the resistors.

This means that an additional resistor may be placed between the first point A and the third point C, that is between the two inputs of the analog/digital converter 4.

SECOND EMBODIMENT

This embodiment includes the same principal elements as those of the first embodiment. In fact, again the contactors 1 are mounted in parallel, one resistor 2 being mounted in series with each of the contactors 1. Here again, there is also an electric voltage power source 3, the digital/analog converter 4 and the processing circuit 5, these various elements being connected to the circuit of the contactors 1 in the same way.

On the other hand, the connecting of the contactor 1 is different. All the first contacts $A_N$ are nevertheless interconnected and to a first point A. Similarly, all the second contacts $B_N$ are interconnected and to a second point B. Similarly, the other end of each contactor branch $C_N$ is connected to a third point C.

However, a resistor 7 with a value R equivalent to the value of the resistor 2 is placed between each contact $A_N$ and $B_N$ of a given contactor.

This circuit is able to detect the number of open or closed contactors. On the other hand, it cannot identify the open or closed contactor(s).

By measuring the resistor $R_{AC}$ between the first point A and the third point C and the resistor $R_{BC}$ between the second point B and the third point C, a pair of values is thus obtained on each measurement. Knowing the value of the resistors 2 and 7 used, it is possible to detect the values able to be obtained in each combination for opening or closing the contactors 1. On the other hand, in the case where the measuring devices, namely the processing unit 5, would detect a pair of values $R_{AC}$, $R_{BC}$ which would not be coherent with the values mentioned previously, one could conclude that a malfunction has occured or an electric wire has broken.

This circuit is thus able to distinguish the malfunction or electric cutoff state at an open position of one or several contactors.

The diagrams of FIGS. 3A and 3B show that the representation of the connecting of the contactors 1 of this second embodiment is equivalent to another representation, namely that of FIG. 3B. In this case, a resistor 2 is still placed in series with the contactor. On the other hand, the latter no longer has the resistor 7 connecting these two contacts A and B and has a fourth resistor 9 connecting the first contact A to the resistor 2 and also a fourth resistor 9 connecting the second contact B to the resistor 2. These two diagrams of FIGS. 3A and 3B are electrically equivalent.

The following table gives, according to the number n of closed doors, the coherent pairings of the values of the resistors $R_{AC}$, $R_{BC}$.

| n | RAC | RBC |
|---|---|---|
| 4 | R/4 | R/2 |
| 3 | 5/19 | 7/19 |
| 2 | 3/10 | 3/10 |
| 1 | 7/19 | 5/19 |
| 0 | R/2 | R/4 | n = number of doors in a closed position;
$R_{AC}$ = resistor between the points A and C according to FIG. 2;
$R_{BC}$ = resistor between the points B and C according to FIG. 2;
R = resistor 2, 7 (or 9) according to FIGS. 2, 3A and 3B.

APPLICATION TO A THRUST REVERSER

It can be readily understood that if the first contacts $A_N$ and second contacts B of these two embodiments of the circuit of the invention are end-of-travel contactors placed respectively on turbojet engine elements where the doors of the thrust reverser come into contact, it is easy to detect the number of doors effectively open. Moreover, with the first embodiment of the circuit of the invention, it is possible to identify the open or closed door(s).

It is to be noted that the circuit only has three connection wires connecting it to the computer. This proportion makes it possible to envisage increasing the number of contactors in the system for monitoring the functioning of this turbojet engine without having to worry about the large number of material problems concerning the interfaces.

In the embodiment of the circuit of the invention, it is preferable to use resistors insensitive to thermic drifts. Similarly, the value of the resistors shall be selected according to the processing electronics.

The design of the circuits of the invention makes it possible to reduce their total weights with an equal function.

This reduction of the weight is linked to the reduction of the number of electric wires, contacts and the size of the associated connectors, these reductions clearly also reducing costs.

By associating this technique with detection of the drift of the electric voltage delivered and with a processing logic, it is possible to detect the ageing of the contactors or a new malfunction and thus increase the reliability and safety of the system.

As stated earlier, a gain is obtained concerning the number of discrete inputs for the computer. This also results in the suppression of a multiplexing of discrete inputs.

In the case of the use of several contactors so as to account for of a single event, the circuit is able to know the state of the proper functioning of each contactor and thus avoid any dormant malfunctions.

The conception of the circuit of the invention offers the possibility of adding discreet inputs, that is additional contactors without modifying the structure of the computer.

What is claimed is:

1. A circuit for detecting the position of bipolar contactors arranged in parallel, each bipolar contactor having a lever which contacts one of a first point and a second point, said circuit comprising:

a plurality of first resistors of a first resistance each connected in series with the lever of each bipolar contactor;

a voltage power source connected between said first point of each bipolar contactor and said second point of each bipolar contactor;

a plurality of third points each connected in series with each of said first resistors;

an analog/digital converter connected between said first points and said third points which receives signals therefrom and outputs a measuring signal; and a processing circuit connected to the output of the analog/digital converter, which determines the positions of each of the bipolar contactors.

2. A circuit according to claim 1, wherein second resistors of a second resistance are connected between each of said third points.

3. A circuit according to claim 1, wherein the resistance of said first resistors is twice as great as the resistance of said second resistors.

4. A circuit according to claim 1, wherein third resistors of a third resistance are connected between the first and second points of each bipolar contactor.

5. A circuit according to claim 4, wherein the resistance of the first resistors and the resistance of the third resistors are equal.

6. A circuit according to claim 1, wherein the lever of each bipolar contactor is connected to a door of a thrust reverser of a turbojet engine such that the two possible positions of the levers indicate open and closed positions of the doors.

* * * * *